United States Patent
Wang et al.

(10) Patent No.: US 10,017,878 B2
(45) Date of Patent: Jul. 10, 2018

(54) GROWTH METHOD OF GRAPHENE

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Haomin Wang, Shanghai (CN); Shujie Tang, Shanghai (CN); Guangyuan Lu, Shanghai (CN); Tianru Wu, Shanghai (CN); Da Jiang, Shanghai (CN); Guqiao Ding, Shanghai (CN); Xuefu Zhang, Shanghai (CN); Hong Xie, Shanghai (CN); Xiaoming Xie, Shanghai (CN); Mianheng Jiang, Shanghai (CN)

(73) Assignee: SHANGHAI INSTITUTE OF MICROSYSTEM AND INFORMATION TECHNOLOGY, CHINESE ACADEMY OF SCIENCES, Changning District, Shanghai (CN)

( * ) Notice: Subject to any disclaimer, the term of this patent is extended or adjusted under 35 U.S.C. 154(b) by 0 days.

(21) Appl. No.: 14/762,012

(22) PCT Filed: Mar. 26, 2015

(86) PCT No.: PCT/CN2015/075115
§ 371 (c)(1),
(2) Date: Jul. 20, 2015

(87) PCT Pub. No.: WO2016/149934
PCT Pub. Date: Sep. 29, 2016

(65) Prior Publication Data
US 2018/0002831 A1    Jan. 4, 2018

(51) Int. Cl.
C30B 25/04    (2006.01)
C30B 25/20    (2006.01)
(Continued)

(52) U.S. Cl.
CPC ........ *C30B 25/205* (2013.01); *C23C 14/0605* (2013.01); *C23C 14/28* (2013.01);
(Continued)

(58) Field of Classification Search
CPC ......... C30B 29/02; C30B 25/00; C30B 25/04; C30B 21/02
See application file for complete search history.

(56) References Cited

PUBLICATIONS

Murakami et al "Direct synthesis of large area graphene on insulating substrate by gallium vapor-assisted chemical vapor depsoition", Applied Physics Letters 106 Mar. 3, 2015 pp. 1-11.*

(Continued)

*Primary Examiner* — Robert M Kunemund
(74) *Attorney, Agent, or Firm* — Global IP Services; Tianhua Gu

(57) ABSTRACT

The present invention provides a growth method of grapheme, which at least comprises the following steps: S1: providing an insulating substrate, placing the insulating substrate in a growth chamber; S2: heating the insulating substrate to a preset temperature, and introducing a gas containing catalytic element into the growth chamber; S3: feeding carbon source into the growth chamber and growing a graphene thin film on the insulating substrate. The present invention adopts a catalytic manner of introducing catalytic element, and rapid grows a high quality graphene on the insulating substrate, which avoids the transition process of the graphene, enables to improve the production yield of the graphene, reduces the growth cost of the graphene, and thus the mass production can be facilitated. The graphene grown by the present invention may be applied in the field of novel (Continued)

graphene electronic devices, graphene transparent conducting film, transparent conducting coating and the like.

8 Claims, 3 Drawing Sheets

(51) Int. Cl.
    *C30B 29/02*     (2006.01)
    *C30B 23/02*     (2006.01)
    *C23C 14/06*     (2006.01)
    *C23C 14/28*     (2006.01)
    *C23C 16/26*     (2006.01)
    *C23C 16/50*     (2006.01)

(52) U.S. Cl.
    CPC .............. *C23C 16/26* (2013.01); *C23C 16/50* (2013.01); *C30B 23/025* (2013.01); *C30B 29/02* (2013.01)

(56) References Cited

PUBLICATIONS

Kim et al "Copper-vapor-assisted chemical vapor depsoition for high quality and metal free single layer graphene on amorphous SiO2 substrate" ACS NANO vol. 7. No. 8 2013 pp. 6575-6582.*
Teng et al "Remote catalyzation for direct formation of graphene layers on oxides", NANO letters 2012 pp. 1379-1384.*

* cited by examiner

GROWTH METHOD OF GRAPHENE

BACKGROUND OF THE PRESENT INVENTION

Field of Invention

The present invention belongs to the field of low-dimensional material and advanced material, and relates to a growth method of graphene.

Description of Related Arts

Graphene was discovered by Geim et al. of the Britain's University of Manchester in 2004. Graphene has various superior natures, comprising thinnest thickness, strongest lattice, high transmittance for visible light, high thermal conductivity, high hardness, high electronic mobility, zero effective mass, ballistic transport at room temperature and high tolerance of current density six orders higher than that of copper, and the like, with the result of showing huge utilization potentiality in the field of the next generation of transistor, transparent conducting film, sensor and the like.

Currently, the popular preparation methods of graphene include: micromechanical cleavage, pyrolytic silicon carbide (SiC), chemical vapor deposition (CVD) on a transition-group metal or other metallic substrate, as well as chemical intercalating oxidation method. Wherein, the CVD method is the most reliable method for mass production of the graphene with relative high quality. Up to now, in the CVD method, the graphene is mainly prepared on the transition metal. After growth, the prepared CVD graphene requires to be transferred to a insulating substrate for further application. The transfer process of graphene itself is a complicated, destructive and high-cost process, which is extremely detrimental to the large-scale mass production; in the meanwhile, it is inescapable to introduce defects and impurities in the transfer process, which greatly reduces the property of the graphene.

In order to preserve the electronic property of the graphene and to lower production cost, it may be one of the solutions to directly grow the graphene on an insulating substrate to avoid the transfer process.

Since the substrate lacks of catalytic function, the graphene grown on insulating substrate features slow growth rate, requires relative longer growth time and the obtained graphene has poor quality. Xie, Xiaoming group of Shanghai Institute of Microsystem and Information Technology, Chinese Academy of Sciences has reported a preparation method of graphene on hBN substrate by using CVD method in the article "Direct growth of few layer graphene on hexagonal boron nitride by chemical vapor deposition" in the journal of Carbon. However, the graphene prepared by this method fails to completely cover the hBN substrate, and the thickness control is difficult. The article "Direct graphene growth on insulator" by G. Lippert et al. has proposed a growth method of graphene on mica surface by MBE method, but the obtained graphene is of poor quality. The article "Oxygen-Aided Synthesis of Polycrystalline Graphene on Silicon Dioxide Substrates" by Chen, Jianyi et al. has proposed a method for directly growing graphene on $SiO_2$/Si surface by CVD method, by which the prepared graphene thin film is a polycrystalline film with a crystalline domain less than 1 µm, a carrier mobility merely of $531 cm^2 V^{-1} S^{-1}$, and with a relative slow growth rate, and it requires 7~8 hours for growing a monolayer graphene. The article "Catalyst-free growth of nanographene film on various substrates" by Zhang Lianchang et al. has reported a growth method of nanographene on various substrates by PECVD method, in which the growth duration is generally 2~5 hours, and the prepared graphene is of nano-sized graphene domains, with the result of poor quality.

Therefore, it is necessary to provide a method for rapidly growing high quality graphene direct on a surface of an insulating substrate surface.

SUMMARY OF THE PRESENT INVENTION

In view of the above disadvantages in the prior art, the object of the present invention is to provide a growth method of graphene, to solve the problems of slow growth rate of graphene grown on a surface of an insulating substrate surface, low quality of graphene, small single crystalline domain, and high defect density in the prior art.

In order to achieve the above object and other related objects, the present invention provides a growth method of graphene, which at least comprises the following steps:

S1: providing an insulating substrate, placing the insulating substrate in a growth chamber;

S2: heating the insulating substrate to a preset temperature, and introducing a gas flow containing gaseous catalytic element into the growth chamber;

S3: feeding carbon source into the growth chamber, and growing a graphene thin film on the insulating substrate.

Optionally, in step S2, the gas containing catalytic element is a gaseous compound or gaseous elementary substance.

Optionally, in step S2, outside the growth chamber, a solid compound or a solid elementary substance containing the catalytic element is vaporized, and the vaporized gas is fed into the growth chamber, or, a liquid compound or a liquid elementary substance containing the catalytic element is vaporized, and the vaporized gas is fed into the growth chamber.

Optionally, the vaporized gas is fed into the growth chamber by a carrier gas.

Optionally, in step S2, a solid compound or a solid elementary substance containing the catalytic element is placed in the growth chamber, then the solid compound or the solid elementary substance is heated to a preset temperature, to evaporate the solid compound or the solid elementary substance, so that the growth chamber is introduced with gas containing the catalytic element.

Optionally, in step S2, a liquid compound or a liquid elementary substance containing the catalytic element is placed in the growth chamber, then the liquid compound or the liquid elementary substance is heated to a preset temperature, to evaporate the liquid compound or the liquid elementary substance, so that the growth chamber is introduced with gas containing the catalytic element.

Optionally, in step S3, the graphene thin film is grown by a thermal chemical vapor deposition method, a low pressure chemical vapor deposition method, a plasma enhanced chemical vapor deposition method or a pulsed laser deposition method.

Optionally, the catalytic element comprises at least one of iron, copper, nickel, silicon, cobalt, lead, tin, germanium, gallium or silver.

Optionally, the compound is a hydride, carbide or hydrocarbon.

Optionally, the insulating substrate is a sapphire, silicon carbide, quartz, hexagonal boron nitride, cubic boron nitride, strontium titanate or glass.

Optionally, the graphene thin film is a monolayer graphene, a double layer graphene or a three layer graphene.

Optionally, the graphene thin film features a crystalline domain size of 1~200 micrometers.

Optionally, the carbon source comprises at least one of methane, ethylene, acetylene, benzene, PMMA and graphite.

Optionally, a growth temperature range of the graphene thin film is 800~1500° C., and a range of a growth time is 5~60 minutes.

From the above, the growth method of graphene of the present invention has the following beneficial effects: by a catalytic manner of introducing catalytic element in the present invention, a high quality graphene is rapidly grown on the insulating substrate. During the process of growing graphene on the insulating substrate, since the substrate lacks of catalysis, the growth rate of the graphene is very slow, and a large amount of defects may be introduced in the crystal lattice of the graphene; in the meanwhile, because of slow growth rate, high nucleation density, the crystalline domains of graphene of the eventually obtained graphene thin film is quite small. By introducing gaseous catalytic element, the catalytic atoms would adsorb around the edge of the graphene in the growth process, to form a chemical bond weaker than carbon-carbon bond; the catalytic atoms adsorbing around the edge of the graphene enables to continue bonding with an active carbon group for capturing an active group, and a transposition between the active atoms and the catalytic atoms is realized by metathesis to achieve the growth of graphene. In the process, the total result is that a potential barrier for an active carbon group bonding with a graphene is reduced by the catalytic atoms, so that the growth rate of the graphene can be greatly improved under the same growth temperature. In the meanwhile, because of the existence of catalytic atoms, the probability of the active carbon group being relaxation to an optimum location becomes large, and the introduced defect density in the growth process is reduced. As such, the gaseous catalytic element not only improves the growth rate of the graphene, but also reduces the defect density of graphene. The growth method of the present invention enables to grow high quality graphene thin film on the insulating substrate, and to avoid the transition process of the graphene; the growth method of the present invention also features relative high growth rate of the graphene, which helps not only improving the production yield of the graphene, but also greatly reducing the growth cost of the graphene, and thus the mass production can be facilitated; the graphene grown by the present invention may be applied in the field of novel graphene electronic devices, graphene transparent conducting film, transparent conducting coating and the like.

ILLUSTRATIONS OF REFERENCE SIGNS

S1~S3 Step

DETAILED DESCRIPTION OF THE PREFERRED EMBODIMENTS

The embodiment modes of the present invention are described hereunder through specific examples, and persons skilled in the art may easily understand other advantages and efficacies of the present invention from the contents disclosed in the present description. The present invention may be further implemented or applied through other different specific embodiment modes, and various modifications or amendments may also be made to each of the details in the present description based on different perspectives and applications without departing from the spirit of the present invention.

Please refer to FIG. 1 to FIG. 5. It is to be noted that the drawings provided in the present embodiment only explain the basic conception of the present invention in an illustrative manner, so the drawings only display the components relevant to the present invention rather than being drawn according to the number, shape and size of the components during actual implementation, the shape, number and scale of each component may be randomly changed during its actual implementation, and the layout of the components thereof might also be more complicated.

Figure 1:
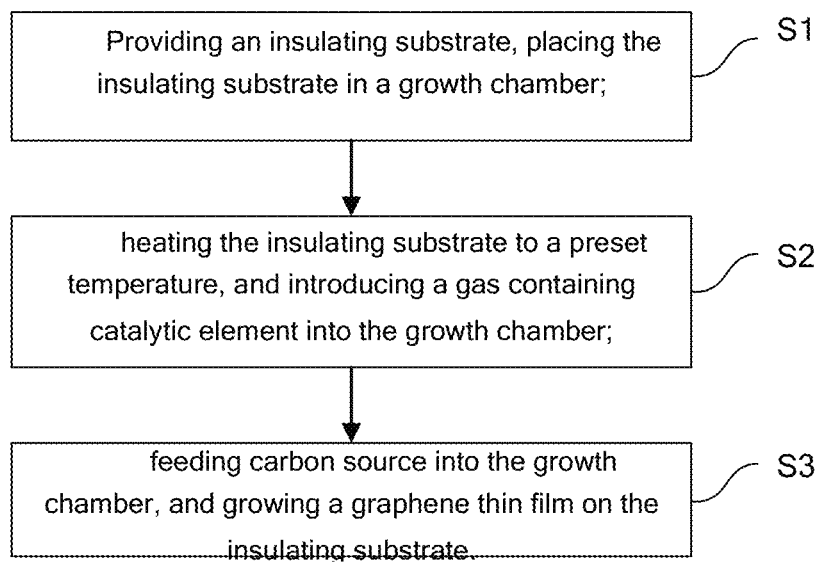
FIG. 1 shows a process flow diagram of a growth method of a graphene of the present invention.

The present invention provides a growth method of graphene, please refer to FIG. 1, which is shown to a process flow diagram of the growth method of the graphene, at least comprising the following steps:

S1: providing an insulating substrate, placing the insulating substrate in a growth chamber;

S2: heating the insulating substrate to a preset temperature, and introducing a gas containing catalytic element into the growth chamber;

S3: feeding carbon source into the growth chamber, and growing a graphene thin film on the insulating substrate.

Embodiment 1:

Firstly perform step S1: providing an insulating substrate, placing the insulating substrate in a growth chamber.

Specifically, the insulating substrate may be sapphire, silicon carbide, quartz, hexagonal boron nitride, cubic boron nitride, strontium titanate or glass, or the like. In the present invention, the insulating substrate is preferably hexagonal boron nitride (hBN), and the preparation method thereof is that: taking a hexagonal boron nitride single crystal as a raw material, mechanically stripping a silicon substrate with a silicon dioxide layer on an upper surface (silicon dioxide/silicon substrate) to obtain a hexagonal boron nitride layer with a fresh cleavage plane, so as to form a hexagonal boron nitride/silicon dioxide/silicon substrate. The hexagonal boron nitride thin film has a similar crystal structure with the graphene, and has better insulativity, thermal conductivity as well as chemical stability, with the result that when growing the graphene on the hexagonal boron nitride, it is beneficial for improving the quality of the graphene. In the present invention, the growth chamber is set forth in terms of tube furnace, the hexagonal boron nitride/silicon dioxide/silicon substrate is placed in the tube furnace, and hydrogen-argon gas mixture is fed. In the present embodiment, the flow velocity of the hydrogen-argon gas mixture is preferably 300sccm, the volume ratio of the hydrogen and the argon is preferably 1:2.

Next, perform step S2: heating the insulating substrate to a preset temperature, and introducing a gas containing a catalytic element into the growth chamber.

Specifically, the temperature of the tube furnace is raised to the preset temperature in a certain heating rate, so that the insulating substrate is heated to the preset temperature. In the present embodiment, it is preferable to be heated up to 1100° C. in a heating rate of 20° C./min and maintained at the temperature.

Specifically, the catalytic element comprises at least one of iron, copper, nickel, silicon, cobalt, lead, tin, germanium, gallium or silver. The gas containing the catalytic element may be gaseous compound or gaseous elementary substance. The compound comprises hydride, carbide or hydrocarbon corresponding to the catalytic element, such as silane, germane, ferrocene and the like.

In the growth chamber, the introduction of the gas containing the catalytic element comprises the following several types:

1) As for the elementary substance of iron, copper, nickel, silicon, cobalt, lead, tin, germanium, gallium or silver or the like, since it is a solid state at ambient temperature, and it is required to vaporize the solid elementary substance, then the vaporized gas is introduced into the growth chamber; as for the elementary substance with relative low melting point, e.g., gallium (the melting point of gallium is 29.76° C.), it is a liquid state under the condition of being slightly higher than the ambient temperature, and under non-ambient temperature condition, the liquid elementary substance would be vaporized and the vaporized gas would be fed into the growth chamber.

2) As for the compound containing the catalytic element of iron, copper, nickel, silicon, cobalt, lead, tin, germanium, gallium or silver or the like, in the case that the compound at ambient temperature is gaseous state, such as silane, germane and the like, the gaseous compound can be directly introduced into the growth chamber or be introduced into the growth chamber by a carrier gas, e.g. Ar or the like. In the case that the compound is solid state at ambient temperature, e.g., ferrocene or the like, it is required to vaporize the solid stated compound followed by feeding the vaporized gas into the growth chamber; In the case that the compound is a liquid state at ambient temperature, e.g., cyclohexadiene iron tricarbonyl, octamethyl cyclotetrasiloxane, tetrapropyl orthosilcate, N-(2-aminoethyl)-3-amino propyl methyl dimethoxy silane, Tetra methoxy germanium or Germanium isopropoxide or the like, it is also required to vaporize the solid stated compound followed by feeding the vaporized gas into the growth chamber.

Besides, as for the above compound, that is a gas at ambient temperature, the gaseous state compound outside the growth chamber is introduced into the growth chamber through a conveying pipeline.

As for the above elementary substance or compound, that is a solid at ambient temperature, the gas containing the catalytic element can be fed into the growth chamber by adopting the following two manners:

i) The compound or elementary substance containing the catalytic element may be vaporized by an evaporator or other heaters outside the growth chamber, and the vaporized gas is then directly fed into the growth chamber or fed into the growth chamber by a carrier gas. In this manner, the solid elementary substance or solid compound may be powdery or blocklike (e.g., such as nano-iron, iron foil and the like), or a block formed by compacting powdery elementary substance or compound, such as a pellet of nano-irons.

ii) The compound or elementary substance containing the catalytic element is directly placed in the growth chamber, and the compound or elementary substance is heated to a preset temperature to evaporate the compound or elementary substance, so as to introduce a gas containing the catalytic element in the growth chamber. The compound or elementary substance, as well as the insulating substrate are placed in the growth chamber, and the compound or elementary substance is vaporized when the insulating substrate is heated to a preset temperature. In this manner, the solid elementary substance or compound is preferably blocklike, which helps to avoid the contamination of powder to the obtained sample. The block is formed by tableting nano-irons. As for liquid elementary substance or compound, it also may be evaporated and vaporized in the growth chamber by adopting the manner, or be vaporized outside the growth chamber followed by being fed into the growth chamber.

It should be noted that, the above vaporization refers to heating the compound or elementary substance containing the catalytic element, which is further maintained at a specific temperature range to keep its vapor pressure at a certain range, so as to provide the gaseous catalytic element.

In this embodiment, gallium is set forth in terms of a catalytic element and the above manner 1) introducing the gas of catalytic element into the growth chamber is adopted. To be specific, placing gallium in the evaporator, setting temperature as 600° C. to evaporate gallium, and feeding the gas of gallium into the tube furnace by taking argon as a carrier gas, with a flow velocity of 50 sccm.

Then, perform step S3: feeding carbon source into the growth chamber, and growing a graphene thin film on the insulating substrate.

Specifically, the carbon source comprises at least one of methane, ethylene, acetylene, benzene, PMMA (polymethyl methacrylate) and graphite. The growth temperature range of the graphene thin film is 800~1500° C., and the range of a growth time is 5~60 minutes. In this embodiment, acetylene is taken as a carbon source as an example. Hydrogen-acetylene gas mixture of 50 sccm is fed into the tube furnace, with a mixing ratio of 1:2, then the graphene thin film is grown on the insulating substrate for 20 minutes at 1100° C. Wherein, hydrogen plays a role to regulate the reaction process. Finally, the feed of Ar carrier gas and hydrogen-acetylene gas mixture is stopped and the temperature is cooled.

In the growth method of graphene of the present invention, in a catalytic manner of introducing catalytic element, high quality graphene is rapidly grown on the insulating substrate. During the growth process, the catalytic atoms would adsorb around the edge of the graphene in the growth process, to form a chemical bond weaker than carbon-carbon bond; the catalytic atoms adsorbing around the edge of the graphene enables to continue bonding with an active carbon group for capturing an active group, and a transposition between the active atoms and the catalytic atoms is realized by metathesis to achieve the effect of graphene growth. In the process, the total results is that a potential barrier for a active carbon group bonding with a graphene is reduced by the catalytic atoms, so that the growth rate of the graphene can be greatly improved under the same growth temperature. In the meanwhile, because of the existence of catalytic atoms, the probability of the active carbon group being relaxation to an optimum location becomes large, and the introduced defeat density in the growth process is reduced.

As such, the gaseous catalytic element functions both as improving the growth rate of the graphene and as reducing the defect density of the graphene.

Figure 2:
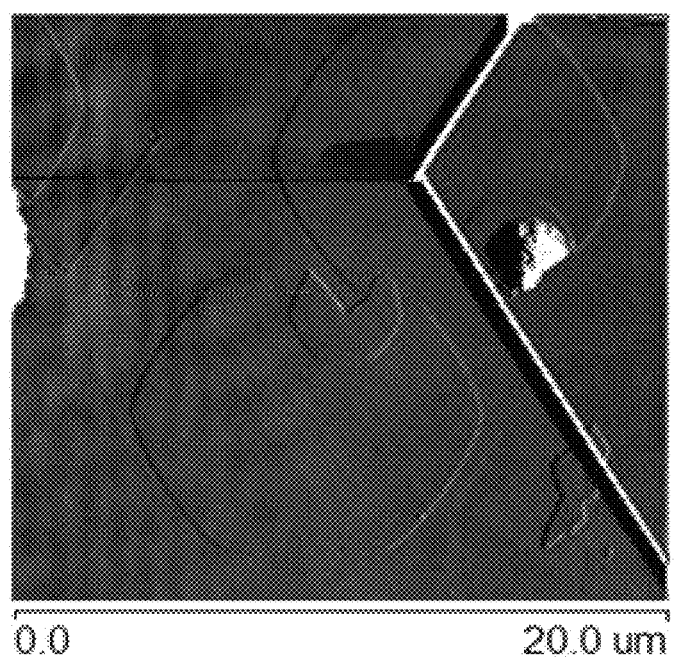
FIG. 2 shows an atomic force microscopy micrograph of a graphene thin film grown in a first embodiment of a growth method of a graphene of the present invention.
Figure 3:
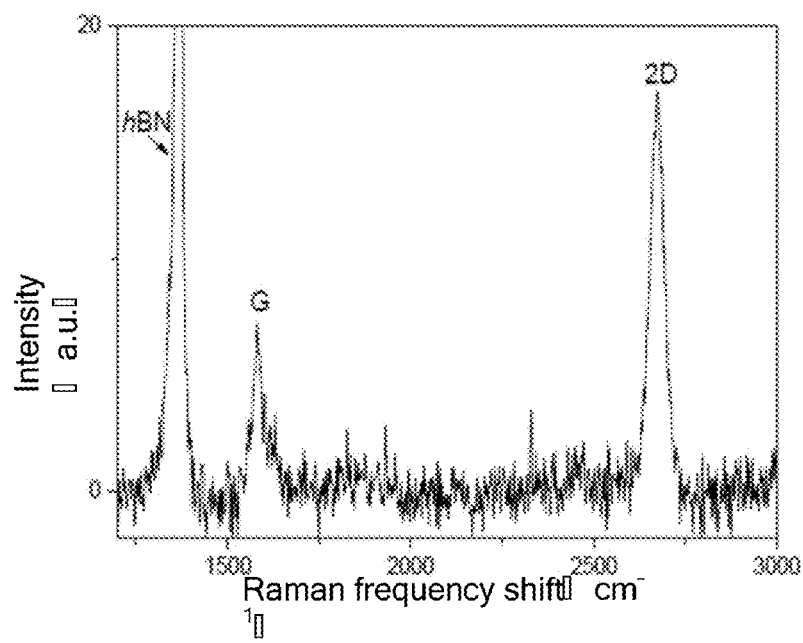
FIG. 3 shows a Raman spectrum of a graphene thin film grown in a first embodiment of the growth method of a graphene of the present invention.
Figure 4:
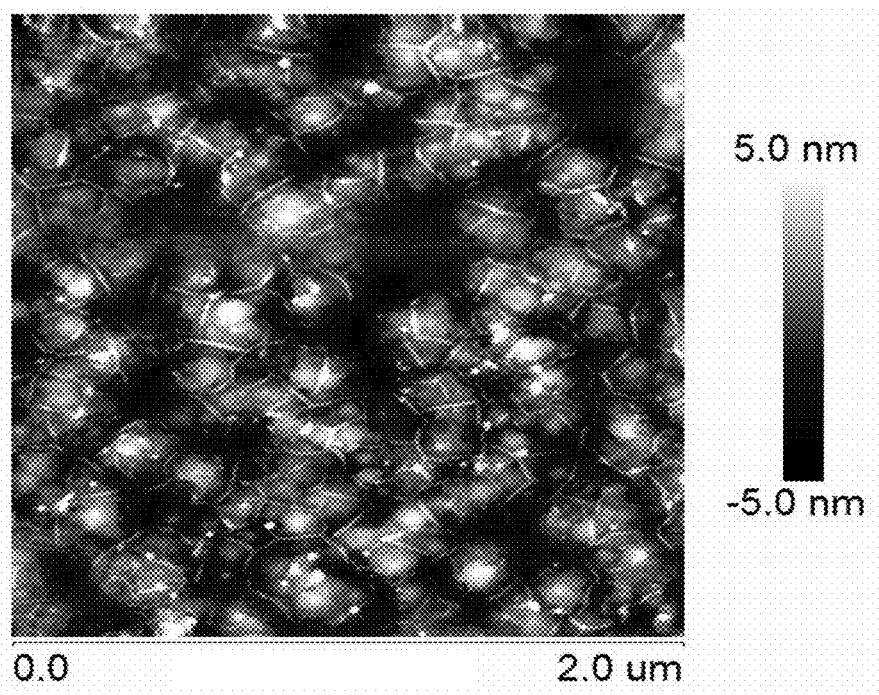
FIG. 4 shows an atomic force microscopy micrograph of a graphene thin film grown in a second embodiment of a growth method of a graphene of the present invention.
Figure 5:
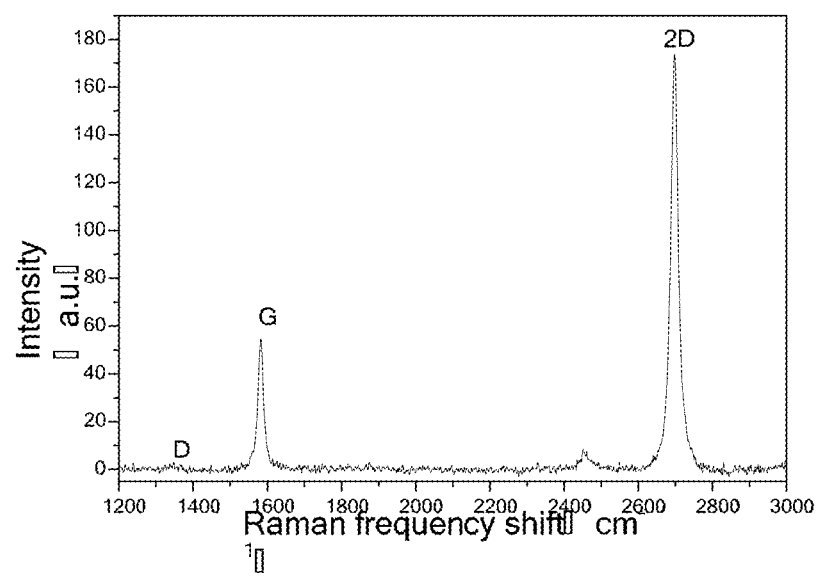
FIG. 5 shows a Raman spectrum of a graphene thin film grown in the second embodiment of a growth method of a graphene of the present invention.

Please refer to FIG. 2 and FIG. 3, which are respectively shown to an atomic force microscopy micrograph and a Raman spectrum of a graphene thin film grown in the embodiment. It can be seen that, by the above technology, the grown graphene single crystal has a domain size of 10 micrometer (i.e., a diameter of 10 micrometer), and from the analysis of the Raman spectrum, it can be known that the grown graphene thin film grown in the embodiment is a single-layer graphene, i.e., one atom layer. In other embodiments, by changing parameters, such as the growth temperature, growth time, gas flow, etc., a double layer graphene or a three layer graphene can be obtained, and the domain size thereof may be varied within the range of 1~200 micrometers.

In the present embodiment, a thermal chemical vapor deposition method is adopted to grow the graphene thin film, while in other embodiments, it may also adopt a low pressure chemical vapor deposition method (LPCVD), a plasma enhanced chemical vapor deposition method (PECVD) or a pulsed laser deposition method (PLD) to grow the above graphene thin film according to different insulating substrate and carbon source. The growth temperature varies with the used growth method, and varies within the range of 800~1500° C., and the growth time varies within 5~60 minutes as well.

The growth method of graphene in the present invention enables to grow high quality graphene thin film on the insulating substrate, and to avoid the transition process of the graphene; the growth method of the present invention also features relative high growth rate of the graphene, which helps not only improving the production yield of the graphene, but also greatly reducing the growth cost of the graphene, and thus the mass production can be facilitated; the graphene grown by the present invention may be applied in the field of novel graphene electronic devices, graphene transparent conducting film, transparent conducting coating and the like.

Embodiment 2:

In the present embodiment, the graphene thin film is grown by the low pressure chemical vapor deposition method.

Firstly perform step S1: providing an insulating substrate, placing the insulating substrate in a growth chamber.

Specifically, a sapphire substrate is used as the insulating substrate. The sapphire substrate is firstly washed, and then is placed in a tube furnace. In the present embodiment, the manner ii) introducing catalytic element in the first embodiment is adopted, and thus in the present step, a compacted pellet of nano-iron powder is together placed in the tube furnace, and hydrogen-argon gas mixture is fed. Wherein, the flow velocity of the hydrogen-argon gas mixture is preferably 300 sccm, the volume ratio of the hydrogen and the argon is preferably 1:2.

Next, perform step S2: heating the insulating substrate to a preset temperature, and introducing a gas containing catalytic element into the growth chamber.

Specifically, the temperature of the tube furnace is raised to 1200° C. in a heating rate of 20° C./min, and remains constant. In the process, both the sapphire substrate and the compacted pellet of nano-iron powder are heated to 1200° C., and iron vapor is evaporated from the compacted pellet of nano-iron powder and acts as a gaseous catalytic element.

Then, perform step S3: feeding carbon source into the growth chamber, and growing a graphene thin film on the insulating substrate.

Specifically, hydrogen-methane gas mixture (with a ratio of 1:10) is fed in a flow velocity of 22 sccm, and the pressure is maintained at 10 Pa by using a vacuum pump, and the growth lasts for 10 min. after finishing the growth, $C_2H_2$ gas is cut off, Ar is fed as protecting gas, and the temperature is natural cooled.

By using the above technology, a graphene thin film of single layer is grown. Please refer to FIG. 4, which is shown to an atomic force microscopy micrograph of the region covered with graphene thin film. And further refer to FIG. 5, which is shown to a Raman spectrum of a graphene thin film, one can analyze that the graphene thin film is graphene thin film of single layer.

The growth method of the present invention enables to grow high quality graphene thin film on the insulating substrate, and to avoid the transition process of the graphene; the growth method of the present invention also features relative high growth rate of the graphene, which helps not only improving the production yield of the graphene, but also greatly reducing the growth cost of the graphene, and thus the mass production can be facilitated; the graphene grown by the present invention may be applied in the field of novel graphene electronic devices, graphene transparent conducting film, transparent conducting coating and the like.

Embodiment 3:

In the present embodiment, the graphene thin film is grown by the pulsed laser deposition method.

Firstly perform step S1: providing an insulating substrate, placing the insulating substrate in a growth chamber.

Specifically, a strontium titanate substrate is used as the insulating substrate. The strontium titanate substrate is washed and placed in a tube furnace. In the present embodiment, the manner ii) introducing catalytic element in the first embodiment is adopted, and thus in the present step, a germanium pellet, that serves as a catalyst, is together placed in the tube furnace.

Next, perform step S2: heating the insulating substrate to a preset temperature, and introducing a gas containing catalytic element into the growth chamber.

Specifically, the strontium titanate substrate and the germanium pellet are heated to 900° C. In the process, a germanium vapor is evaporated from the germanium and acts as a gaseous catalytic element.

Then, perform step S3: feeding carbon source into the growth chamber, and growing a graphene thin film on the insulating substrate.

Specifically, in the present embodiment, a graphite target serves as a carbon source, the pressure in the growth chamber is set as 1 Pa, and the laser frequency is 10 Hz. Under the action of the laser, carbon element is evaporated from the graphite target and is further used as a carbon source, the growth is performed at 900° C. for 20 minutes, i.e., a graphene thin film of single layer is grown on the strontium titanate substrate.

The growth method of the present invention enables to grow high quality graphene thin film on the insulating substrate, and to avoid the transition process of the graphene; the growth method of the present invention also features relative high growth rate of the graphene, which helps not only improving the production yield of the graphene, but also greatly reducing the growth cost of the graphene, and thus the mass production can be facilitated; the graphene grown by the present invention may be applied in the field of novel graphene electronic devices, graphene transparent conducting film, transparent conducting coating and the like.

In conclusion, by a catalytic manner of introducing catalytic element in the present invention, a high quality graphene is rapid grown on the insulating substrate. During the process of growing graphene on the insulating substrate, since the substrate lacks of catalysis, the growth rate of the graphene is very slow, and a large amount of defects may be introduced in the crystal lattice of the graphene; in the meanwhile, because of slow growth rate, high nucleation density, the crystalline domains of graphene in the eventually obtained graphene thin film is quite small. By introducing gaseous catalytic element, the catalytic atoms would adsorb around the edge of the graphene in the growth process, to form a chemical bond weaker than carbon-carbon bond; the catalytic atoms adsorbing around the edge of the graphene enables to continue bonding with an active carbon group for capturing an active group, and a transposition between the active atoms and the catalytic atoms is realized by metathesis to achieve the effect of graphene growth. In the process, the total results is that a potential barrier for a active carbon group bonding with a graphene is reduced by the catalytic atoms, so that the growth rate of the graphene can be greatly improved under the same growth temperature. In the meanwhile, because of the existence of catalytic atoms, the probability of the active carbon group being relaxation to an optimum location becomes large, and the introduced defeat density in the growth process is reduced. As such, the gaseous catalytic element functions both as improving the growth rate of the graphene and as reducing the defect density of the graphene. The growth method of the present invention enables to grow high quality graphene thin film on the insulating substrate, and to avoid the transition process of the graphene; the growth method of the present invention also features relative high growth rate of the graphene, which helps not only improving the production yield of the graphene, but also greatly reducing the growth cost of the graphene, and thus the mass production can be facilitated; the graphene grown by the present invention may be applied in the field of novel graphene electronic devices, graphene transparent conducting film, transparent conducting coating and the like. Therefore, the present invention effectively overcomes a variety of disadvantages in the prior art and has high industrial utility value.

The abovementioned embodiments only illustratively describe the principle and efficacy of the present invention, rather than being used to limit the present invention. Any person skilled in the art may modify or amend the abovementioned embodiments without departing from the spirit and scope of the present invention. Thus, all equivalent modifications or amendments accomplished by persons having common knowledge in the technical field concerned without departing from the spirit and technical thoughts revealed by the present invention shall still be covered by the claims of the present invention.

What is claimed is:

1. A growth method of graphene comprising the following steps:

S1: providing an insulating substrate, placing the insulating substrate in a growth chamber;

S2: heating the insulating substrate to a preset temperature, and introducing a gas containing catalytic element into the growth chamber;

S3: feeding carbon source into the growth chamber, and growing a graphene thin film on the insulating substrate;

in step S2, the gas containing catalytic element is a gaseous compound or gaseous elementary substance;

the gaseous compound is a hydride, carbide or hydrocarbon;

the gaseous element substance comprises at least one of iron, nickel, silicon, cobalt, lead, tin, germanium, and silver;

the carbon source comprises at least one of ethylene, acetylene, benzene, PMMA and graphite;

by introducing the gaseous catalytic element into the growth chamber, catalytic atoms are absorbed around an edge of the graphene in the growth process to form a chemical bond which is weaker than a carbon-carbon bond, that enables to continue bonding with an active carbon group and a transposition between active carbon atoms and catalytic atoms is realized by metathesis to achieve the growth of graphene.

2. The growth method of graphene according to claim 1, characterized in that: in step S2, outside the growth chamber, a solid compound or a solid elementary substance containing the catalytic element is vaporized, and the vaporized gas is fed into the growth chamber, or, a liquid compound or a liquid elementary substance containing the catalytic element is vaporized, and the vaporized gas is fed into the growth chamber.

3. The growth method of graphene according to claim 2, characterized in that: the vaporized gas is fed into the growth chamber by a carrier gas.

4. The growth method of graphene according to claim 1, characterized in that: in step S3, the graphene thin film is grown by a thermal chemical vapor deposition method, a low pressure chemical vapor deposition method, a plasma enhanced chemical vapor deposition method or a pulsed laser deposition method.

5. The growth method of graphene according to claim 1, characterized in that: the insulating substrate is a sapphire, silicon carbide, quartz, hexagonal boron nitride, cubic boron nitride, strontium titanate or glass.

6. The growth method of graphene according to claim 1, characterized in that: the graphene thin film is a monolayer graphene, a double layer graphene or a three layer graphene.

7. The growth method of graphene according to claim 1, characterized in that: the graphene thin film features a crystalline domain size of 1~200 micrometers.

8. The growth method of graphene according to claim 1, characterized in that: a growth temperature range of the graphene thin film is 800~1500° C., and a range of a growth time is 5~60 minutes.

* * * * *